(12) United States Patent
Nagai (10) Patent No.: US 11,825,594 B2
(45) Date of Patent: Nov. 21, 2023

(54) SEMICONDUCTOR DEVICE HAVING ELECTRIC COMPONENT BUILT IN CIRCUIT BOARD

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventor: Shohei Nagai, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 0 days.

(21) Appl. No.: 17/679,622

(22) Filed: Feb. 24, 2022

(65) Prior Publication Data
US 2022/0322515 A1 Oct. 6, 2022

(30) Foreign Application Priority Data
Mar. 30, 2021 (JP) .................. 2021-058206

(51) Int. Cl.
*H05K 1/02* (2006.01)
*H05K 1/11* (2006.01)
(Continued)

(52) U.S. Cl.
CPC .......... *H05K 1/021* (2013.01); *H05K 1/0206* (2013.01); *H05K 1/03* (2013.01); *H05K 1/115* (2013.01); *H05K 1/185* (2013.01)

(58) Field of Classification Search
CPC ........ H05K 1/021; H05K 1/0206; H05K 1/03; H05K 1/115; H05K 1/185; H05K 3/4688;
(Continued)

(56) References Cited

U.S. PATENT DOCUMENTS

| 10,535,581 B2 * | 1/2020 | Fujinaga ............. H01L 23/3675 |
| 2009/0168367 A1 * | 7/2009 | Fujii ................... H01L 23/3677 361/720 |

(Continued)

OTHER PUBLICATIONS

U.S. Appl. No. 17/679,314, filed Feb. 24, 2022, Nagai et al.
U.S. Appl. No. 17/679,603, filed Feb. 24, 2022, Nagai.

*Primary Examiner* — Ishwarbhai B Patel
(74) *Attorney, Agent, or Firm* — POSZ LAW GROUP, PLC (57) ABSTRACT

A semiconductor device includes: a substrate main body having a first surface and a second surface; an electric component arranged in the substrate main body; a surface conductor pattern arranged in a first circuit layer located on the second surface. Also included is a first internal conductor pattern and a second internal conductor pattern arranged in a second circuit layer located between the electric component and the second surface, and insulated from each other. Also, at least one first heat conductor via extends from the electric component to the first internal conductor pattern; and at least one second heat conductor via extends from the surface conductor pattern to the second internal conductor pattern.

9 Claims, 4 Drawing Sheets

(51) Int. Cl.
*H05K 1/18* (2006.01)
*H05K 1/03* (2006.01)
(58) Field of Classification Search
CPC ........... H05K 23/3677; H05K 23/3672; H05K 23/481
See application file for complete search history.

(56) References Cited

U.S. PATENT DOCUMENTS

| | | | |
|---|---|---|---|
| 2010/0025082 A1* | 2/2010 | Sasaoka | H05K 1/186 29/592.1 |
| 2014/0211437 A1* | 7/2014 | Ueta | H05K 1/186 361/761 |
| 2016/0020194 A1* | 1/2016 | Gottwald | H01L 24/25 257/774 |
| 2020/0013690 A1 | 1/2020 | Hata et al. | |

\* cited by examiner

SEMICONDUCTOR DEVICE HAVING ELECTRIC COMPONENT BUILT IN CIRCUIT BOARD

CROSS REFERENCE TO RELATED APPLICATION

The present application claims the benefit of priority from Japanese Patent Application No. 2021-058206 filed on Mar. 30, 2021. The entire disclosure of the above application is incorporated herein by reference.

TECHNICAL FIELD

The present disclosure relates to a semiconductor device having an electrical component built in a circuit board.

BACKGROUND

A conceivable technique teaches a semiconductor device. This semiconductor device includes a substrate main body (as core base material) and an electric component arranged in the substrate main body. A surface conductor pattern is provided on the lower surface of the substrate main body, and an internal conductor pattern is provided between the electric component and the second surface. Then, the electric component and the first internal conductor pattern are connected by a plurality of heat conductor vias. According to such a configuration, the heat of the electric component is transferred to the internal conductor pattern through the plurality of heat conductor vias, further transferred from the internal conductor pattern to the surface conductor pattern, and radiated to the outside of the substrate main body.

SUMMARY

According to an example embodiment, a semiconductor device may include: a substrate main body having a first surface and a second surface; an electric component arranged in the substrate main body; a surface conductor pattern arranged in a first circuit layer located on the second surface; a first internal conductor pattern and a second internal conductor pattern arranged in a second circuit layer L5 located between the electric component and the second surface, and insulated from each other; at least one first heat conductor via extending from the electric component to the first internal conductor pattern; and at least one second heat conductor via extending from the surface conductor pattern to the second internal conductor pattern.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

In a conceivable semiconductor device, an insulation layer made of the material of the substrate main body is provided between the internal conductor pattern and the surface conductor pattern. According to such a configuration, it is possible to electrically insulate between the internal conductor pattern and the surface conductor pattern. However, there is a difficulty that heat conduction from the internal conductor pattern to the surface conductor pattern may be suppressed by the insulation layer. Further, while a plurality of heat conductor vias are disposed in the layer located on one side of the internal conductor pattern, such heat conductor vias are not disposed in the insulation layer located on the other side of the internal conductor pattern. Thus, the mechanical properties differ greatly between the two layers adjacent to the internal conductor pattern. As a result, when the temperature of the substrate main body rises, there may be a difficulty of causing non-uniform thermal deformation of the substrate main body, such as warping or waviness of the substrate main body.

In view of the above, the present embodiments provide a technique capable of improving the thermal conductivity and mechanical properties of the substrate main body while maintaining the insulating property of the electric component in the semiconductor device having the electric component built in the circuit board.

The semiconductor device disclosed in the present embodiments includes: a substrate body main having a first surface and a second surface; an electric component arranged in the substrate main body; a surface conductor pattern arranged in the circuit layer located on the second surface; a first internal conductor pattern and a second internal conductor pattern arranged in a circuit layer located between the electric component and the second surface and insulated from each other; at least one first heat conductor via extending from the electric component to the first internal conductor pattern, and at least one second heat conductor via extending from the surface conductor pattern to the second internal conductor pattern.

In the above configuration, the circuit layer located between the electric component and the second surface is provided with the first internal conductor pattern and the second internal conductor pattern insulated from each other. The first internal conductor pattern is connected to the electric component through at least one first heat conductor via. The second internal conductor pattern is connected to the surface conductor pattern on the second surface through at least one second heat conductor via. As a result, the heat generated in the electric component is transferred to the first internal conductor pattern through the first heat conductor via, and further transferred to the second internal conductor pattern. Then, the heat of the second internal conductor pattern is transferred to the surface conductor pattern through the second heat conductor via, and is radiated from the surface conductor pattern to the outside of the substrate main body. Although the first internal conductor pattern and the second internal conductor pattern are isolated from each other, they are located in the same circuit layer, so that the heat transfer between them is relatively high. Further, since the first heat conductor via and the second heat conductor via are disposed in the two layers adjacent to the circuit layer, the mechanical properties do not differ significantly between the two layers. As described above, it is possible to improve the heat conduction and the mechanical properties of the substrate main body while maintaining the insulating property of the electric component.

In one embodiment of the present embodiments, the at least one second heat conductor via may include an internal heat conductor via 78a located in a region where the electric component and the second surface face each other, and an outer heat conductor via 78b located at an outer side of the facing region. According to such a configuration, the second heat conductor via can be effectively arranged in a range in which the heat generated in the electric component passes through the substrate main body while diffusing.

In one embodiment of the present embodiments, the semiconductor device may include a third internal conductor pattern 66 disposed in a circuit layer L4 located in the same depth range as the electric component and is electrically insulated from the electric component, and at least one third via 79 extending from the second conductor pattern to the third internal conductor pattern. According to such a configuration, the heat generated by the electric component can be guided to the second surface of the substrate main body from more directions with respect to the electric component.

In one embodiment of the present embodiments, the substrate main body may include a first layer 13 made of a first material and a second layer 15 made of a second material having higher thermal conductivity than the first material. In this case, the second layer may be located between the electrical component and the second surface. According to such a configuration, the heat generated by the electric component can be diffused over a wide range of the substrate main body through the second layer.

In the above-described embodiment, the second layer may be exposed on the second surface. According to such a configuration, the heat diffused in the substrate main body through the second layer can be radiated from the second surface of the substrate main body to the outside of the substrate main body.

In the above-described embodiment, the second material may include at least one selected from the group including paper, glass cloth, glass non-woven fabric, glass woven cloth and glass fiber, and at least one selected from the group including phenol resin, epoxy resin, polyimide resin and Teflon (registered trade mark). According to such a configuration, the thermal conductivity of the second layer can be effectively enhanced while maintaining the original characteristics required for the substrate main body.

In one embodiment of the present disclosure, the semiconductor device may further include a surface electric component provided on the first surface and controlling the operation of the electric component. According to the configuration according to the present embodiments most of the heat generated by the electric component can be directed to the second surface of the substrate main body, and the temperature rise on the first surface of the substrate body is suppressed. By arranging the surface electric component on the first surface, it is possible to suppress the temperature rise of the surface electric component.

In one embodiment, the material constituting the first heat conductor via may be similar to or the same as the material constituting the first internal conductor pattern. According to such a configuration, in the process of manufacturing the semiconductor device, for example, the first heat conductor via and the first internal conductor pattern can be formed simultaneously or continuously.

In one embodiment, the material constituting the second heat conductor via may be similar to or the same as the material constituting the surface conductor pattern. According to such a configuration, in the process of manufacturing the semiconductor device, for example, the second heat conductor via and the surface conductor pattern can be formed simultaneously or continuously.

In one embodiment of the present disclosure, the electric component may include a power semiconductor device 21, 22 and a heat sink plate 31, 32 to which the power semiconductor element is bonded. Since a relatively large current flows in a power semiconductor element, the amount of heat generated is also relatively large. The configurations disclosed herein can be suitably adopted for semiconductor devices including such power semiconductor devices.

Embodiment 1

The semiconductor device 10 of the first embodiment will be described with reference to the drawings. The semiconductor device 10 of this embodiment is adopted, for example, in a power control unit of an electric vehicle, and can form a part of a power conversion circuit for power conversion between a power supply and a traveling motor. The electric vehicle in the present embodiment broadly means a vehicle having a motor for driving wheels, and for example, an electric vehicle charged by an external electric power, a hybrid vehicle having an engine in addition to the motor, a fuel cell vehicle having a fuel cell as the power source and the like. However, the application of the semiconductor device 10 according to the embodiment may not be limited to the electric vehicle, and may be applied to a variety of electrical apparatuses.

Figure 1:
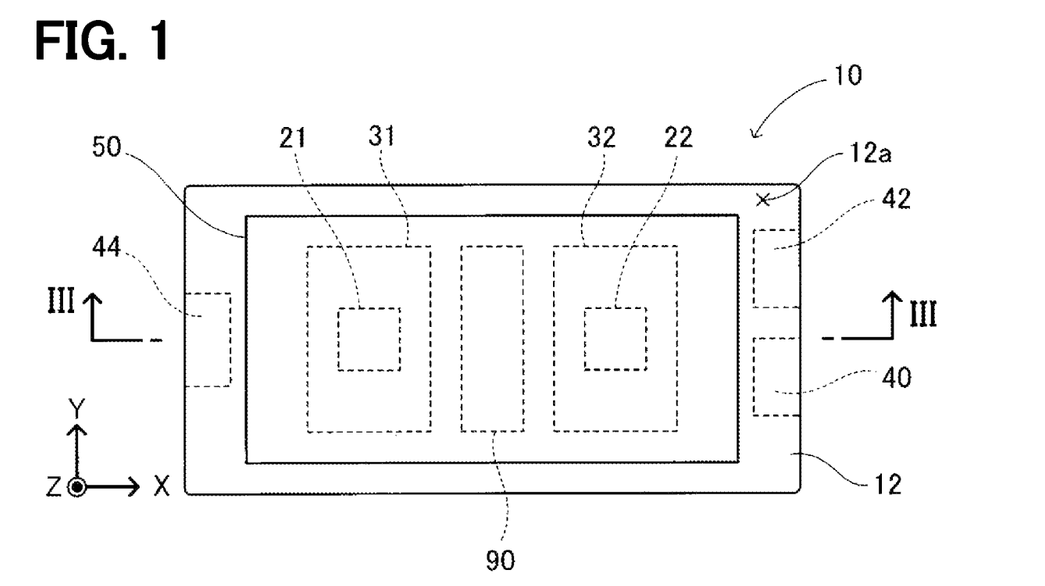
FIG. 1 is a plan view showing a semiconductor device of the first embodiment.
Figure 2:
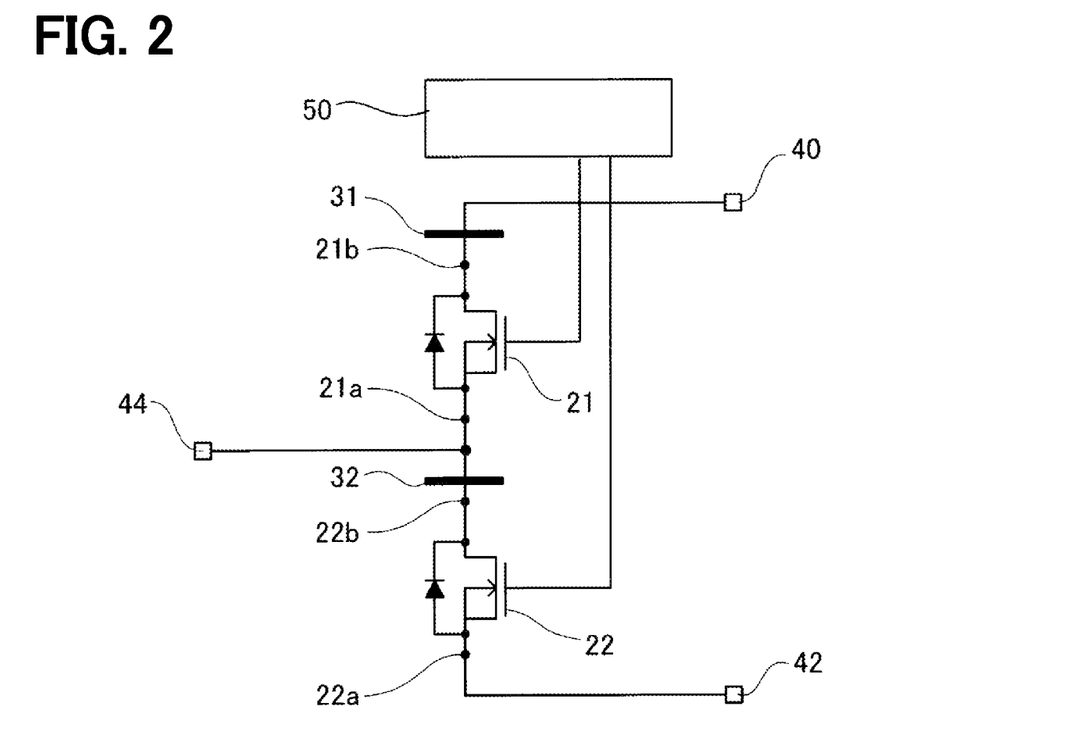
FIG. 2 is a circuit diagram showing a circuit structure of the semiconductor device of the first embodiment.
Figure 3:
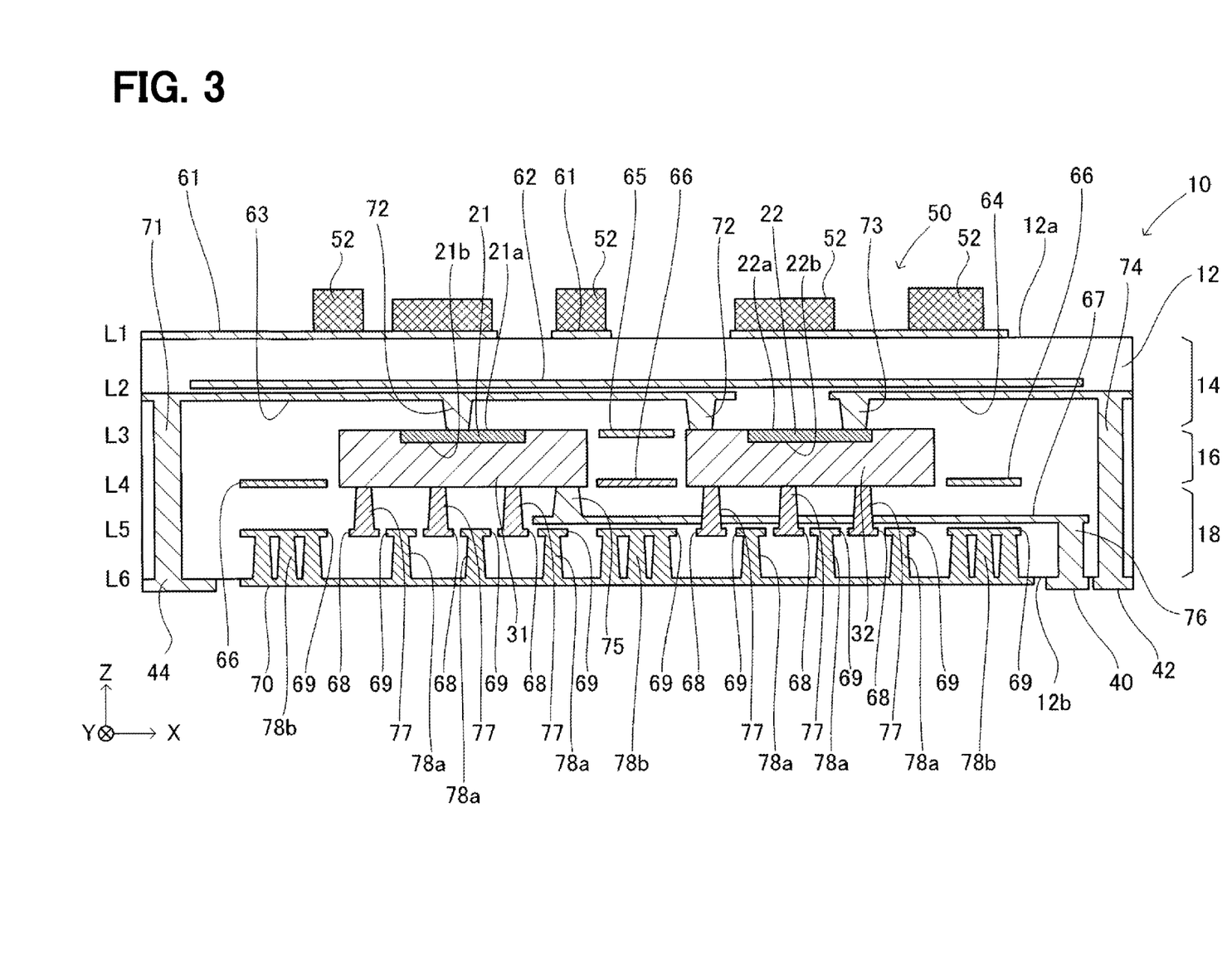
FIG. 3 is a cross-sectional view taken along the line III-III in FIG. 1; for clarity of the drawing, hatching of the substrate main body is omitted, and further, some of the overlapping configurations are shown by intentionally changing their positions.

As shown in FIGS. 1 to 3, the semiconductor device 10 includes a substrate main body 12, two semiconductor elements 21 and 22, and two heat sink plates 31 and 32. The substrate main body 12 has a boarded shape or a plate-like shape. The substrate main body 12 has an upper surface 12a and a lower surface 12b. The lower surface 12b is arranged at a side opposite to the upper surface 12a. The substrate main body 12 is made of an insulator, for example, an epoxy resin or other resin material. The substrate main body 12 includes an upper layer 14, an intermediate layer 16, and a lower layer 18 in an order from the upper surface 12a to the lower surface 12b. The upper layer 14 is a layer including the upper surface 12a of the substrate main body 12. The lower layer 18 is a layer including the lower surface 12b of the substrate main body 12. The intermediate layer 16 is a layer arranged between the upper layer 14 and the lower layer 18.

X-direction and Y-direction in the drawings are directions parallel to the upper surface 12a and the lower surface 12b of the substrate 12, and are directions perpendicular to each other. Z-direction is a direction perpendicular to the upper surface 12a and the lower surface 12b of the substrate main body 12, and is a direction perpendicular to each of the X-direction and the Y-direction. That is, the above-mentioned upper layer 14, the intermediate layer 16 and the lower layer 18 are stacked along the Z direction.

The semiconductor elements 21 and 22 and the heat sink plates 31 and 32 are electric components that form a part of an electric circuit in the semiconductor device 10, respectively. The two semiconductor elements 21 and 22 are arranged in the intermediate layer 16 of the substrate main body 12 together with the two heat sink plates 31 and 32. Each of the semiconductor elements 21 and 22 us a power semiconductor element, and in particular, a switching element. This switching element is, for example, an IGBT (Insulated Gate Bipolar Transistor) or a MOSFET (Metal-Oxide-Semiconductor Field-Effective Transistor).

The semiconductor elements 21 to 22 respectively have upper surface electrodes 21a to 22a and lower surface electrodes 21b to 22b, and respectively conduct electricity or block an electrical conduction between the corresponding upper surface electrodes 21a to 22a and the corresponding lower surface electrodes 21b to 22b.

As an example, the two semiconductor elements 21 and 22 include a first semiconductor element 21 and a second semiconductor element 22. The first semiconductor element 21 and the second semiconductor element 22 are electrically connected in series inside the substrate main body 12. As described above, the two semiconductor elements 21 and 22 are switching elements such as IGBTs or MOSFETs. The semiconductor device 10 of this embodiment can form, for example, a part of an inverter circuit or a DC-DC converter circuit. The number of semiconductor elements 21 and 22 may not be limited to two. Further, the semiconductor device 10 may include at least one other electric component in place of the semiconductor elements 21 and 22 and the heat sink plates 31 and 32.

The two heat sink plates 31 and 32 each have a plate-like shape and are arranged in parallel with the substrate main body 12. Each heat sink plate 31, 32 is made of a conductor, for example copper or other metal. As an example, the two heat sink plates 31 and 32 are arranged along the X direction. The two heat sink plates 31 and 32 include a first heat sink plate 31 and a second heat sink plate 32. A first semiconductor element 21 is arranged on the first heat sink plate 31, and the lower surface electrode 21b of the first semiconductor element 21 is electrically connected to the first heat sink plate 31. The first semiconductor element 21 and the first heat sink plate 31 are integrally joined to each other and may be interpreted as one electric component. Similarly, the second semiconductor element 22 is arranged on the second heat sink plate 32, and the lower surface electrodes 21b and 22b of the second semiconductor element 22 are electrically connected to the second heat sink plate 32. The second semiconductor element 22 and the second heat sink plate 32 are also integrally bonded to each other and may be interpreted as one electric component.

The semiconductor device 10 includes a plurality of terminals 40, 42, 44. These terminals 40, 42, and 44 are external connection terminals for connecting to an external circuit. The plurality of terminals 40, 42, 44 are made of a conductor such as copper or other metal. As an example, the plurality of terminals 40, 42, and 44 include a P terminal 40, an N terminal 42, and an O terminal 44. The plurality of terminals 40, 42, and 44 are arranged on the lower surface 12b of the substrate main body 12. Here, a part or all of the plurality of terminals 40, 42, 44 may be arranged on the upper surface 12a of the substrate main body 12.

The P terminal 40 is electrically connected to the first heat sink plate 31 inside the substrate main body 12, and is electrically connected to the lower surface electrode 21b of the first semiconductor element 21 through the first heat sink plate 31. The N terminal 42 is electrically connected to the upper surface electrode 22a of the second semiconductor element 22 inside the substrate main body 12. The O terminal 44 is electrically connected to the upper surface electrode 21a of the first semiconductor element 21 and the second heat sink plate 32 inside the substrate main body 12. That is, the O terminal 44 is electrically connected to each of the upper surface electrode 21a of the first semiconductor element 21 and the lower surface electrode 22b of the second semiconductor element 22. As a result, when the first semiconductor element 21 is turned on, the P terminal 40 and the O terminal 44 are electrically connected to each other. On the other hand, when the second semiconductor element 22 is turned on, the N terminal 42 and the O terminal 44 are electrically connected to each other.

The substrate main body 12 is provided with a plurality of circuit layers L1-L6 to form a multi-layer substrate structure. The plurality of circuit layers L1-L6 include a first circuit layer L1, a second circuit layer L2, a third circuit layer L3, a fourth circuit layer L4, a fifth circuit layer L5, and a sixth circuit layer L6. The first circuit layer L1 is arranged on the upper surface 12a of the substrate main body 12. The second circuit layer L2 is arranged in the upper layer 14 of the substrate main body 12. The third circuit layer L3 is arranged at the boundary between the upper layer 14 and the intermediate layer 16 of the substrate main body 12. The fourth circuit layer L4 is arranged at the boundary between the intermediate layer 16 and the lower layer 18 of the substrate main body 12. The fifth circuit layer L5 is arranged in the lower layer 18 of the substrate main body 12. The sixth circuit layer L6 is arranged on the lower surface 12b of the substrate main body 12.

The first circuit layer L1 has a first conductor pattern 61. The first conductor pattern 61 is made of a conductor such as copper or other metal. The first conductor pattern 61 constitutes a control circuit 50 that controls two semiconductor elements 21 and 22. Therefore, a plurality of surface electric components 52 are mounted on the first conductor pattern 61. The plurality of surface electric components 52 include, for example, a gate drive circuit that controls switching of the semiconductor elements 21 and 22.

The first conductor pattern 61 referred to here is a general term for one or more conductor patterns required to form the control circuit 50. That is, the first conductor pattern 61 may be a single conductor pattern or a combination of a plurality of conductor patterns. The same applies to the second conductor pattern 62 to the tenth conductor pattern 70 described below. Each of the second conductor pattern 62 to the tenth conductor pattern 70 is a general term for one or more conductor patterns having a common function, and may be a single conductor pattern or a combination of a plurality of conductor patterns.

The second circuit layer L2 has a plurality of conductor patterns 62, 63, 64. Each conductor pattern 62, 63, 64 is made of a conductor such as copper or other metal. The plurality of conductor patterns 62, 63, 64 include a second conductor pattern 62, a third conductor pattern 63, and a fourth conductor pattern 64. Here, the plurality of conductor patterns 62, 63, 64 are actually arranged on the same plane, but in FIG. 3, the second conductor pattern 62 is intentionally displaced with respect to the third conductor pattern 63 and the fourth conductor pattern 64 for the purpose of clarifying the illustration.

The second conductor pattern 62 extends over most of the second circuit layer L2 and faces the plurality of semiconductor elements 21 and 22. As a result, the heat generated in the semiconductor elements 21 and 22 is diffused to a wide range of the substrate main body 12 through the second conductor pattern 62. The second conductor pattern 62 also functions as a shield layer that shields electromagnetic noise radiated from the semiconductor elements 21 and 22. Although not particularly limited, the second conductor pattern 62 may be connected to the ground potential, thereby improving the function of the second conductor pattern 62 as a shield layer.

The third conductor pattern 63 is connected to the O terminal 44 through the first via 71. In addition, the third conductor pattern 63 is connected to the upper surface electrode 21a of the first semiconductor element 21 and the second heat sink plate 32 through two second vias 72. The first via 71 and the second via 72 are made of a conductor such as copper or other metal. As a result, the two semiconductor elements 21 and 22 are electrically connected in series by the second conductor pattern 62 and electrically connected to the O terminal 44 through the second conductor pattern 62.

The fourth conductor pattern 64 is connected to the upper surface electrode 22a of the second semiconductor element 22 through the third via 73. In addition, the fourth conductor pattern 64 is connected to the N terminal 42 through the fourth via 74. The third via 73 and the fourth via 74 are made of a conductor such as copper or other metal. As a result, the upper surface electrode 22a of the second semiconductor element 22 is electrically connected to the N terminal 42 through the fourth conductor pattern 64.

Semiconductor elements 21 and 22 and heat sink plates 31 and 32 are arranged in the third circuit layer L3 and the fourth circuit layer L4. The heat sink plates 31 and 32 have a thickness equal to the distance from the third circuit layer L3 to the fourth circuit layer L4. The semiconductor elements 21 and 22 arranged on the heat sink plates 31 and 32 are arranged in the third circuit layer L3. In addition, the third circuit layer L3 and the fourth circuit layer L4 are provided with a fifth conductor pattern 65 and a sixth conductor pattern 66, respectively. The use of the fifth conductor pattern 65 and the sixth conductor pattern 66 is not particularly limited. The fifth conductor pattern 65 and the sixth conductor pattern 66 may be connected to, for example, a ground potential.

The fifth circuit layer L5 has a plurality of conductor patterns 67, 68, 69. Each conductor pattern 67, 68, 69 is made of a conductor such as copper or other metal. The plurality of conductor patterns 67, 68, 69 include a seventh conductor pattern 67, and a eighth conductor pattern 68, and a ninth conductor pattern 69. Here, the plurality of conductor patterns 67, 68, 69 are actually arranged on the same plane, but in FIG. 3, the seventh conductor pattern 67 is intentionally displaced with respect to the eighth conductor pattern 68 and the ninth conductor pattern 69 for the purpose of clarifying the illustration.

The seventh conductor pattern 67 is connected to the first heat sink plate 31 through the fifth via 75. In addition, the seventh conductor pattern 67 is connected to the P terminal 40 through the sixth via 76. The fifth via 75 and the sixth via 76 are made of a conductor such as copper or other metal. As a result, the lower surface electrode 21b of the first semiconductor element 21 is electrically connected to the P terminal 40 through the first heat sink plate 31 and the seventh conductor pattern 67.

The eighth conductor pattern 68 is provided in a range facing the first heat sink plate 31 or the second heat sink plate 32. The eighth conductor pattern 68 is connected to the first heat sink plate 31 and the second heat sink plate 32 through a plurality of seventh vias 77. Each seventh via 77 is made of a conductor such as copper or other metal. As a result, the eighth conductor pattern 68 is electrically and thermally connected to the first heat sink plate 31 and the seventh conductor pattern 67 through the plurality of seventh vias 77. Although not particularly limited, the material constituting the plurality of seventh vias 77 may be similar to or the same as the material constituting the eighth conductor pattern 68, and may be, for example, copper or aluminum.

In the ninth conductor pattern 69, the ninth conductor pattern 69 is provided adjacent to the eighth conductor pattern 68 so that the heat of the eighth conductor pattern 68 is efficiently transferred to the ninth conductor pattern 69. Here, the eighth conductor pattern 68 and the ninth conductor pattern 69 are separated by the material constituting the substrate main body 12, and the eighth conductor pattern 68 and the ninth conductor pattern 69 are electrically insulated from each other. A part of the ninth conductor pattern 69 is located in a range facing the first heat sink plate 31 or the second heat sink plate 32, and another part of the ninth conductor pattern 69 is located outside the facing range.

A plurality of eighth vias 78a and 78b are connected to the ninth conductor pattern 69. The plurality of eighth vias 78a and 78b extend from the ninth conductor pattern 69 to the sixth circuit layer L6 located on the lower surface 12b of the substrate main body 12. Each eighth via 78a, 78b is made of a conductor such as copper or other metal. As a result, the ninth conductor pattern 69 is electrically and thermally connected to the sixth circuit layer L6 through the plurality of eighth vias 78a and 78b.

The plurality of eighth vias 78a, 78b includes at least one internal via 78a and at least one external via 78b. The internal via 78a is located in a facing region where the first heat sink plate 31 or the second heat sink plate 32 is opposed to the lower surface 12b of the substrate main body 12. On the other hand, the external via 78b is located outside the facing region. The range in which the plurality of eighth vias 78a and 78b are arranged is designed so as to match the region where the heat of the first heat sink plate 31 or the second heat sink plate 32 passes through while diffusing in the substrate main body 12.

The sixth circuit layer L6 has a tenth conductor pattern 70. The tenth conductor pattern 70 extends over most of the sixth circuit layer L6 and is provided so as to face the ninth conductor pattern 69 of the fifth circuit layer L5. The tenth conductor pattern 70 is made of a conductor such as copper or other metal. A plurality of eighth vias 78a and 78b are connected to the tenth conductor pattern 69. As a result, the tenth conductor pattern 70 is electrically and thermally connected to the ninth conductor pattern 69 of the fifth circuit layer L5 through a plurality of eighth vias 78a, 78b. Although not particularly limited, the material constituting the tenth conductor pattern 70 may be similar to or the same as the material constituting the eighth vias 78a, 78b, and may be, for example, copper or aluminum.

As described above, in the semiconductor device 10 of this embodiment, the tenth conductor pattern 70 is provided in the circuit layer L6 located on the lower surface 12b of the substrate main body 12. The eighth conductor pattern 68 and the ninth conductor pattern 69, which are insulated from each other, are provided in the circuit layer L5 located between the heat sink plates 31 and 32 and the lower surface 12b of the substrate main body 12. The heat sink plates 31 and 32 and the eighth conductor pattern 68 are connected to each other through at least one seventh via 77. The ninth conductor pattern 69 and the tenth conductor pattern 70 are connected to each other through at least one eighth via 78a and 78b.

According to the above configuration, the heat generated in the semiconductor elements 21 and 22 and the heat sink plates 31 and 32 is transferred to the eighth conductor pattern 68 through the seventh via 77, and further transmitted to the ninth conductor pattern 69 adjacent to the eighth conductor pattern 68. Then, the heat of the ninth conductor pattern 69 is transferred to the tenth conductor pattern 70 through the eighth vias 78a and 78b, and is radiated from the tenth conductor pattern 70 to the outside of the substrate main body 12. Although the eighth conductor pattern 68 and the ninth conductor pattern 69 are isolated from each other, they are located in the same fifth circuit layer L5, so that the heat transfer between them is relatively high. Further, since the seventh via 77 and the eighth vias 78a and 78b are disposed in the upper and lower two layers adjacent to the fifth circuit layer L5, the mechanical characteristics are not significantly different between the two layers. As described above, it is possible to improve the thermal conductivity and mechanical properties of the substrate main body 12 while maintaining the insulating properties of the semiconductor elements 21 and 22 and the heat sink plates 31 and 32.

The semiconductor device 10 according to the first embodiment is an embodiment of the technique disclosed in the present specification, and the content of the present technique is not particularly limited. The substrate main body 12 in this embodiment is an example of the substrate in the present technology. The upper surface 12a and the lower surface 12b of the substrate main body 12 in this embodiment are examples of the first surface and the second surface of the substrate main body in the present technology, respectively. The combination of the first semiconductor element 21 and the first heat sink plate 31 and the combination of the second semiconductor element 22 and the second heat sink plate 32 in this embodiment are examples of electric components in the present disclosure. The tenth conductor pattern 70 in this embodiment is an example of the surface conductor pattern in the present disclosure. The eighth conductor pattern 68 in this embodiment is an example of the first internal conductor pattern in the present technology. The ninth conductor pattern 69 in this embodiment is an example of the second internal conductor pattern in the present disclosure. The ninth via 79 in this embodiment is an example of the heat conductor via in the present disclosure. The seventh via 77 in this embodiment is an example of the first heat conductor via in the present disclosure. The eighth vias 78a and 78b in this embodiment are examples of the second heat conductor vias in the present disclosure. Of the eighth vias 78a and 78b in the present embodiment, the internal via 78a is an example of the internal heat conductor via in the present disclosure, and the external via 78b is an example of the external heat conductor via in the present disclosure. The seventh via 77 in this embodiment is an example of the first heat conductor via in the present disclosure. The surface electric component 52 in this embodiment is an example of the surface electric component in the present technology.

Embodiment 2

Figure 4:
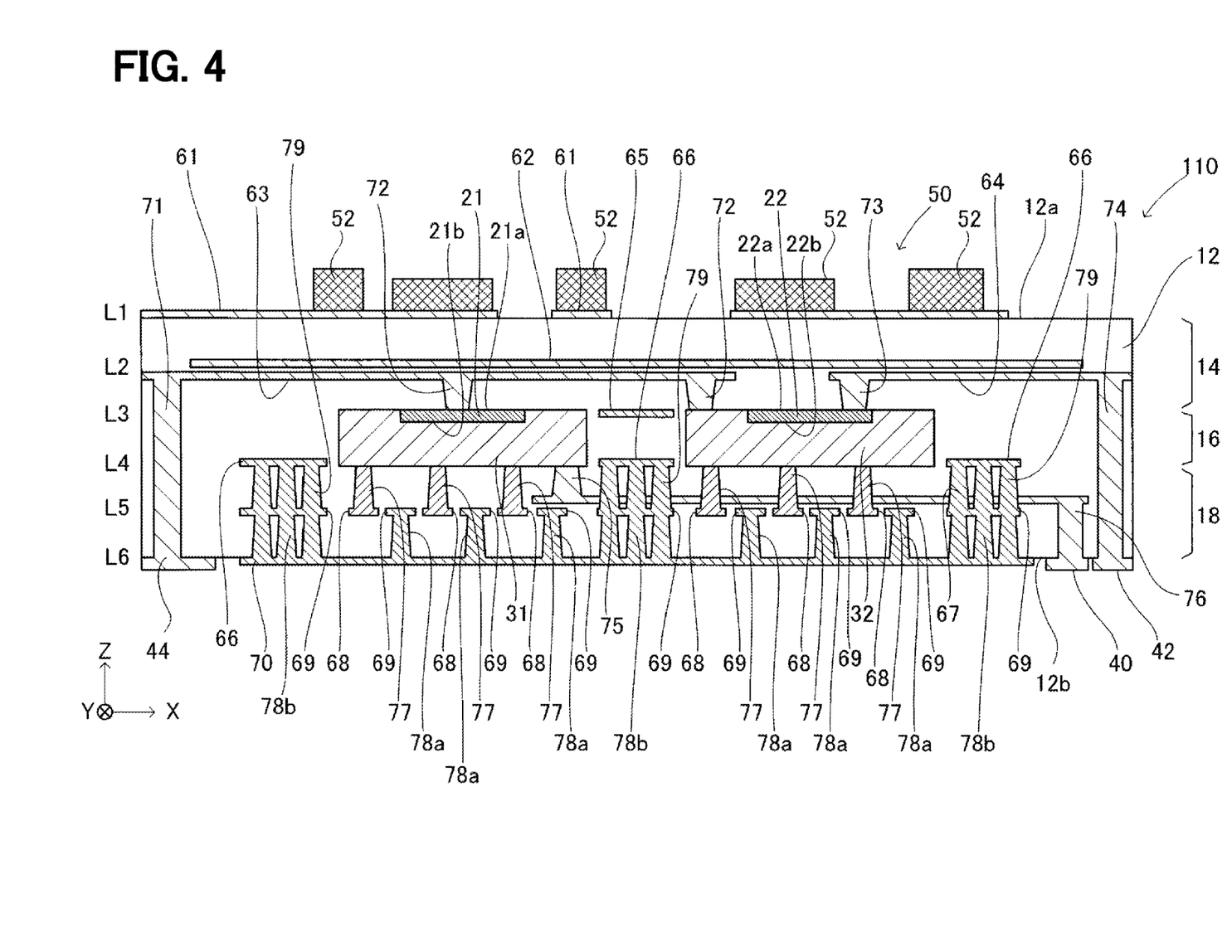
FIG. 4 is a cross-sectional view showing the configuration of the semiconductor device of the second embodiment.

The semiconductor device 110 of the second embodiment will be described with reference to FIG. 4. The semiconductor device 110 of the present embodiment is different from the semiconductor device 10 of the first embodiment in that a plurality of ninth vias 79 are added. In the following, the differences from the first embodiment will be mainly described, and the same reference numerals will be given to the configurations common to the first embodiment, and the description thereof will be omitted.

The plurality of ninth vias 79 extend from the fourth circuit layer L4 to the fifth circuit layer L5, and connects the sixth conductor pattern 66 of the fourth circuit layer L4 and the ninth conductor pattern 69 of the fifth circuit layer L5. Each ninth via 79 is made of a conductor such as copper or other metal. As a result, the sixth conductor pattern 66 is electrically and thermally connected to the ninth conductor pattern 69 through the plurality of ninth vias 79.

The sixth conductor pattern 66 located in the fourth circuit layer L4 is located in the same depth range as the heat sink plates 31 and 32. Therefore, the sixth conductor pattern 66 receives heat diffused from the heat sink plates 31 and 32 in a direction parallel to the substrate main body 12 (that is, in the X direction or the Y direction). The heat of the sixth conductor pattern 66 is transferred to the ninth conductor pattern through the ninth via 79, and further transferred to the tenth conductor pattern 70 through the external via 78b of the eighth vias 78a and 78b. As a result, the heat of the semiconductor elements 21 and 22 and the heat sink plates 31 and 32 is radiated from the tenth conductor pattern 70 to the outside of the substrate main body 12. The sixth conductor pattern 66 is electrically insulated from the semiconductor elements 21 and 22 and the heat sink plates 31 and 32.

The semiconductor device 110 according to the present embodiment is an embodiment of the technique disclosed in the present specification, and the content of the present technique is not particularly limited. The sixth conductor pattern 66 in this embodiment is an example of the third internal conductor pattern in the present technology. The ninth via 79 in this embodiment is an example of the third via in the present disclosure.

Embodiment 3

Figure 5:
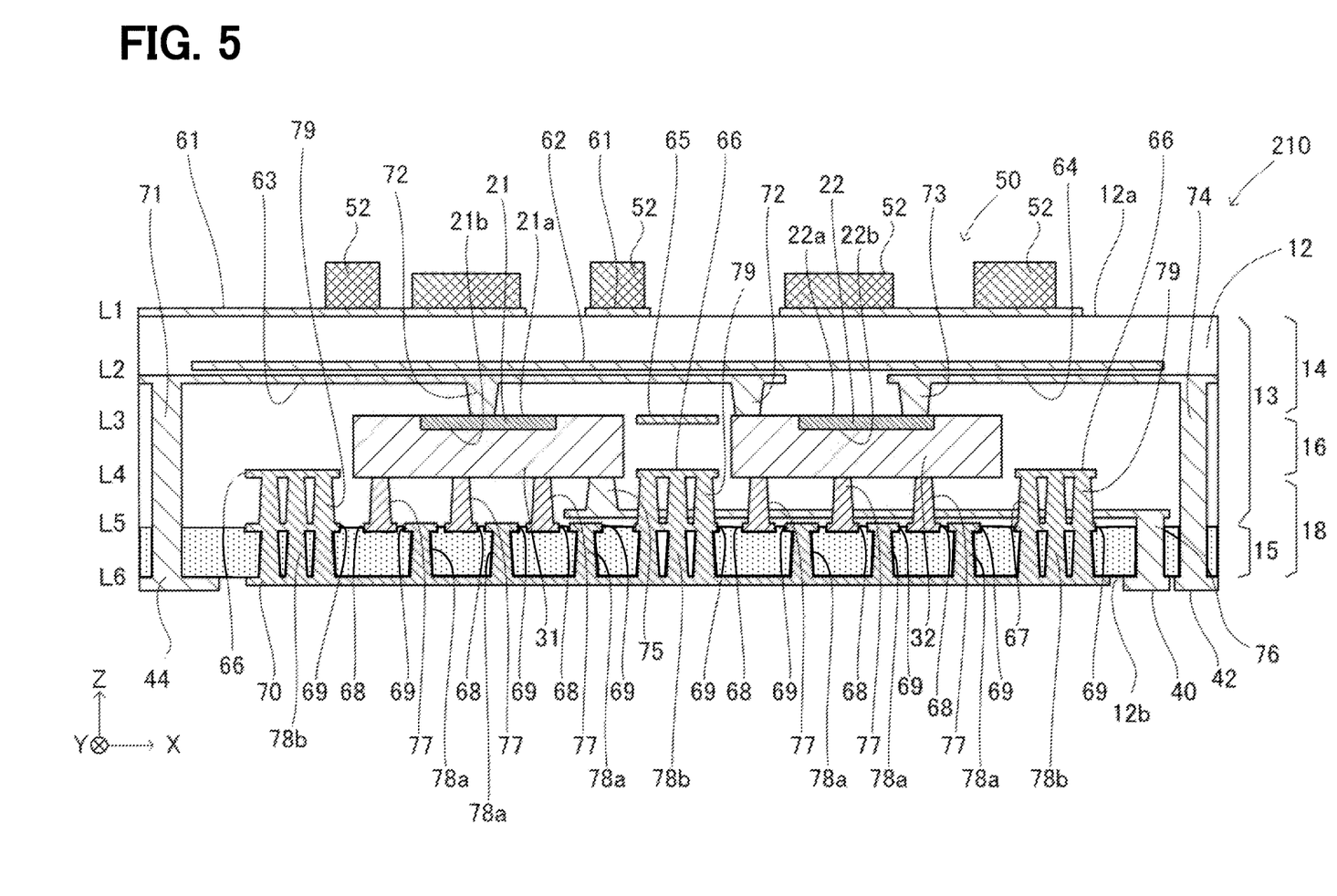
FIG. 5 is a cross-sectional view showing the configuration of the semiconductor device according to the third embodiment.

The semiconductor device 210 of the third embodiment will be described with reference to FIG. 5. The semiconductor device 210 of the present embodiment is different from the semiconductor device 110 of the second embodiment in that the substrate main body 12 has two layers 13 and 15 made of different materials. In the following, the differences from the second embodiment will be mainly described, and the same reference numerals will be given to the configurations common to the first to second embodiments, and the description thereof will be omitted.

The substrate body 12 in this embodiment has a first layer 13 made of a first material and a second layer 15 made of a second material. The first layer 13 includes the above-mentioned upper layer 14 and intermediate layer 16, and a part of the lower layer 18. The second layer 15 is a residual portion of the lower layer 18, and is particularly a portion that fills the space between the fifth circuit layer L5 and the sixth circuit layer L6. That is, the second layer 15 is located at the lowest layer including the lower surface 12b of the substrate main body 12. The second material constituting the second layer 15 has higher thermal conductivity than the first material constituting the first layer 13. By locating the second layer 15 having excellent thermal conductivity between the heat sink plates 31 and 32 and the lower surface 12b of the substrate main body 12, the temperature rise of the semiconductor elements 21 and 22 and the heat sink plates 31 and 32 is further suppressed.

The first material and the second material are not particularly limited. As an example, the second material may be a fibrous-including composite material, so that the second material may include, for example, at least one selected from the group comprising paper, glass cloth, glass non-woven fabric, glass woven cloth and glass fiber and at least one selected from the group comprising phenolic resins, epoxy resins, polyimide resins and Teflon (registered trade mark). As the first material, for example, the resin material exemplified here can be adopted, and further, similar to the second material, fibrous material may be included. As long as the thermal conductivity of the second material is higher than the thermal conductivity of the first material, the combination of the first material and the second material is not particularly limited.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
    a substrate main body having a first surface and a second surface;
    an electric component arranged in the substrate main body;
    a surface conductor pattern arranged in a first circuit layer located on the second surface;
    a first internal conductor pattern and a second internal conductor pattern arranged in a second circuit layer located between the electric component and the second surface, and insulated from each other;
    at least one first heat conductor via extending from the electric component to the first internal conductor pattern; and
    at least one second heat conductor via extending from the surface conductor pattern to the second internal conductor pattern, wherein
    the at least one second heat conductor via includes: an internal heat conductor via located in a facing region where the electric component faces the second surface, and an external heat conductor via located outside the facing region.

2. The semiconductor device according to claim 1, further comprising:
    a third internal conductor pattern arranged in a third circuit layer located in a same depth range as the electric component, and electrically isolated from the electric component; and
    at least one third via extending from the second internal conductor pattern to the third internal conductor pattern.

3. The semiconductor device according to claim 1, wherein:
    the substrate main body includes a first layer made of a first material and a second layer made of a second material having higher thermal conductivity than the first material; and
    the second layer is disposed between the electric component and the second surface.

4. The semiconductor device according to claim 3, wherein:
    the second layer is exposed on the second surface.

5. The semiconductor device according to claim 3, wherein:
    the second material includes:
    at least one selected from the group comprising paper, glass cloth, glass non-woven fabric, glass woven cloth and fiberglass, and
    at least one selected from the group comprising a phenol resin, an epoxy resin, a polyimide resin and a Teflon.

6. The semiconductor device according to claim 1, further comprising:
    a surface electric component arranged on the first surface and controlling an operation of the electric component.

7. The semiconductor device according to claim 1, wherein:
    the first heat conductor via is made of material which is a same as material of the first internal conductor pattern.

8. The semiconductor device according to claim 1, wherein:
    the second heat conductor via is made of material which is a same as material of the surface conductor pattern.

9. The semiconductor device according to claim 1, wherein:
    the electric component includes a power semiconductor element and a heat sink plate to which the power semiconductor element is bonded.

* * * * *